US006656627B2

(12) United States Patent
Yokoyama et al.

(10) Patent No.: US 6,656,627 B2
(45) Date of Patent: Dec. 2, 2003

(54) BATTERY PACK

(75) Inventors: Eizi Yokoyama, Kyoto (JP); Hitoshi Kobayashi, Kyoto (JP); Kenjiro Yamasaki, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 208 days.

(21) Appl. No.: 09/819,694

(22) Filed: Mar. 29, 2001

(65) Prior Publication Data
US 2001/0026888 A1 Oct. 4, 2001

(30) Foreign Application Priority Data
Mar. 29, 2000 (JP) ................................ P.2000-090182

(51) Int. Cl.[7] ............................ H01M 2/10; H01M 2/22
(52) U.S. Cl. ........................ 429/100; 429/96; 429/178; 174/260
(58) Field of Search ...................... 429/100, 96, 178; 439/500; 174/260

(56) References Cited

U.S. PATENT DOCUMENTS 5,766,794 A * 6/1998 Brunette et al. ........ 429/100 X
6,157,545 A * 12/2000 Janninck et al. ........ 429/100 X

* cited by examiner

Primary Examiner—John S. Maples
(74) Attorney, Agent, or Firm—Morgan, Lewis & Bockius LLP

(57) ABSTRACT

A battery pack includes a vessel 2, a battery mounted in the vessel 2 and a circuit board 3 connected to the battery. An opening 6 is formed on the surface of the vessel 2. A thin-film terminal portion 12 is formed on the circuit board 3 so that it is exposed externally through the opening 6. In this configuration, the battery pack can realize reduction in the weight and thickness and also reduce the production cost.

3 Claims, 6 Drawing Sheets

BATTERY PACK

BACKGROUND OF THE INVENTION

1. Field of the Invention

This invention relates to a battery pack which is removable from a portable electronic appliance such as a portable telephone and notebook-size personal computer, and a method of manufacturing the battery pack.

2. Description of the Related Art

Conventionally, a battery pack incorporating a battery such as a lithium ion battery or manganese battery has been prepared for a portable telephone and notebook-size personal computer. The battery pack is adapted to be removable from a body of the portable telephone. The battery pack permits the portable telephone to be used for a certain time with no power supply from a commercial power source.

FIG. 11 is a perspective view showing an example of such a battery pack. FIG. 12 is a perspective view of a circuit board incorporated in the battery pack. The battery pack 1 includes a vessel 2 made of resin and a circuit board 3 connected to a battery (not shown). The circuit board 3 includes a protecting circuit (not shown) for excessive charging and excessive discharging.

As seen from FIG. 12, the circuit board 3 is provided with a terminal stand 4 mounted on its surface and a connecting terminal 7 for connection to the battery. The terminal stand 4 includes a plurality of contact terminals 5 on the upper surface. The circuit board 3 is supported inside the vessel 2 so that the contact terminals 5 are exposed externally through an opening 6 formed on the surface of the vessel 2. The circuit board 3 is adapted to be electrically connectable to a body of the portable telephone in such a manner that the contact terminals 5 on the terminal stand 4 are brought into contact with connector pins (not shown) formed on the body of the portable telephone. Namely, the circuit board 3 supplies power to the body and charges the battery through each of the contact terminals 5 on the terminal stand.

In recent years, for the portable telephone, reduction in component cost and production cost as well as reduction in weight and thickness has been demanded. This also applies to the battery pack which is removed from the portable telephone. However, the terminal stand 4 on the circuit board 3 in the battery pack 1 is generally expensive. This influences the component cost in the entire appliance. In addition, the terminal stand 4 is relatively high in the mounting height to the circuit board 3. This influences the size of the battery pack, thus violating the demand of reduction in the weight and thickness.

SUMMARY OF THE INVENTION

This invention has been accomplished in order to overcome the inconvenience described above.

An object of this invention is to provide a battery pack which can realize reduction in the weight and thickness and also reduce the production cost.

Another object of this invention is to provide a method for manufacturing such a battery pack.

In order to attain the above objects, in accordance with the first aspect of this invention, there is provided a battery pack comprising a vessel, a battery mounted in the vessel and a circuit board connected to the battery, wherein an opening is formed on the surface of the vessel and thin-film terminal portion is formed on the surface of the circuit board so that it is exposed externally through the opening. Concretely, the terminal portion includes a base layer formed on the circuit board and a plated layer formed on the base layer, and the plated layer is made of gold.

In accordance with this invention, the terminal portion of the circuit board, which is to be connected to a body of e.g. a portable telephone and incorporated in the battery pack, is formed as a thin film on the circuit board. For this reason, as compared with the conventional structure provided with an electronic component such as a terminal stand, the structure according to this invention can reduce the component cost and also decreases the mounting height of the components on the circuit board. Thus, the thickness of the battery pack can be reduced. This contributes to reduction in thickness, size and weight of the portable telephone. In addition, the plated layer constituting the uppermost layer of the terminal portion, which is made of gold, increases the anti-corrosiveness and decoration.

In a preferred embodiment of this invention, on the circuit board, an insulating layer is formed in the other area than the area where the terminal portion is formed, and the insulating layer is formed so as to cover a peripheral edge of the plated layer so that the surface of the circuit board and/or the surface of the base layer are not exposed externally. Conventionally, as the case may be, the following event occurred. Owing to the heat generated when the plated layer is formed, the material of the insulating layer contracts so that a gap is generated between the base layer and the insulating layer formed in the other area than the terminal portion is formed. Therefore, when the surface of the base layer and surface of the circuit board are exposed externally through the gap, water or the like invades the gap, and deteriorates the plated layer. However, if the insulating layer is formed so as to cover sufficiently the peripheral edge of the plated layer which is the uppermost layer, even if the insulating layer contracts slightly, generation of such a gap is prevented. Therefore, the surface of the base layer 14 is not exposed externally. This prevents invasion of water, thereby suppressing the surface deterioration of the plated layer. Accordingly, the battery pack which is reliable can be provided.

In accordance with the second aspect of this invention, there is provided a method of manufacturing a battery pack having a vessel, a battery mounted in the vessel and a circuit board connected to the battery, comprising:

a step of forming a terminal portion in manufacturing the circuit board, the step of forming a terminal portion being to stack a base layer of copper and a plated layer of copper successively to form the terminal portion.

In accordance with the manufacturing method described above, the circuit board of the battery pack according to the first aspect of this invention can be easily realized. For this reason, the same effect as that of the battery pack according to the first aspect can be obtained.

Preferably, the method of manufacturing a battery pack further comprises:

a step of forming an insulating layer after the step of forming a terminal potion in manufacturing the circuit board, the step of forming an insulating layer being to form an insulating layer in the other area than the area where the terminal portion is formed, wherein the insulating layer is formed so as to cover a peripheral edge of the plated layer so that the surface of the circuit board and/or the surface of the base layer are not exposed externally. In accordance with this invention, since the insulating layer is formed after the base layer and plated layer have been formed, the insulating layer can be easily formed so as to cover the peripheral edge of the plated layer. For this reason, the same effect as that of the battery pack according to the first aspect can be obtained.

Preferably, said plated layer is protruded on the surface of the insulating layer. In accordance with this invention, secure contact with outer circuit can be obtained.

Preferably, said insulating layer is made of epoxy resin. In accordance with the present invention, since the epoxy resin has elasticity, secure contact with outer circuit can be obtained.

Preferably, said circuit board is a hybrid integrated circuit comprising protecting circuit for excessive charging and excessive discharging.

The above and other objects and features of this invention will be more apparent from the following description taken in conjunction with the accompanying drawings.

DESCRIPTION OF THE PREFERRED EMBODIMENTS

Figure 1:
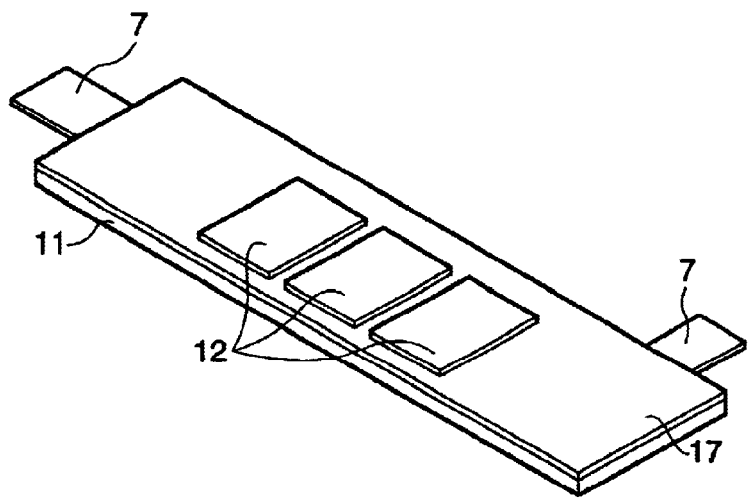
FIG. 1 is a perspective view of a circuit board which is applied to a battery pack according to an embodiment of this invention.

Now referring to the drawings, an explanation will be given of various preferred embodiments of this invention.

Figure 11:
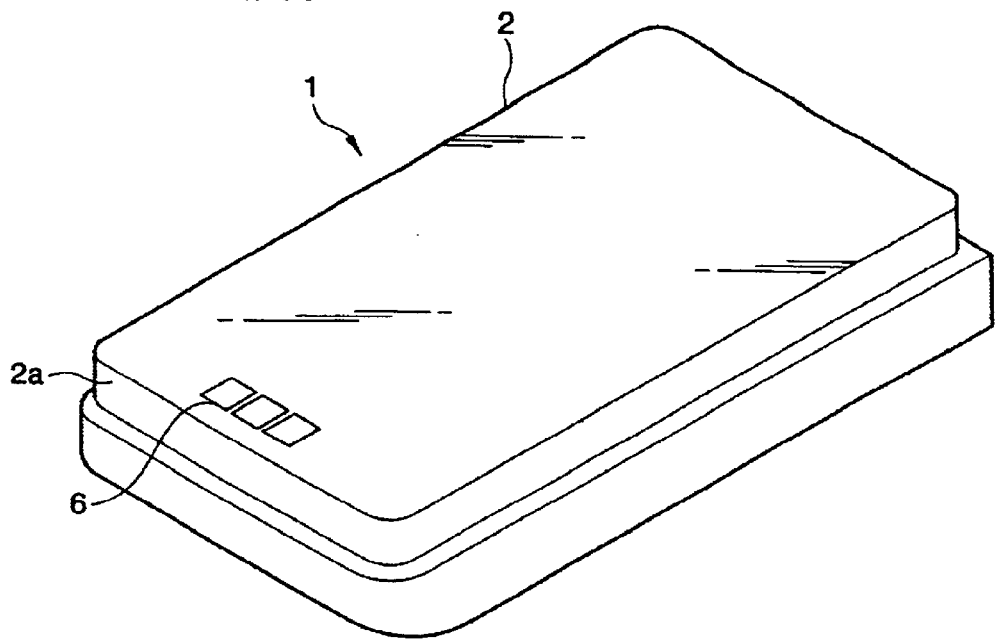
FIG. 11 is a perspective view of a conventional battery pack.
Figure 12:
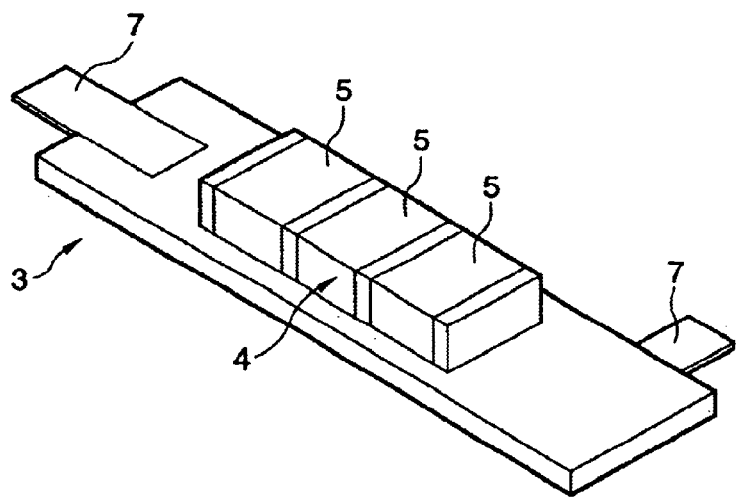
FIG. 12 is a perspective view of a circuit board incorporated in the conventional battery pack.

FIG. 1 is a perspective view of a circuit board according to this invention. In the following description, a reference will be again made to FIG. 11 showing the battery pack described in connection with the related art. It should be noted that the components having the same reference symbols as in FIG. 11 represent the same function.

A battery pack 1 is adapted to be removable from a body (not shown) of e.g. a portable telephone. The battery pack 1 includes a vessel 2 made of resin, a battery (not shown) of e.g. a lithium ion battery, and a circuit board 11 connected to the battery. The circuit board 11 serves to supply electric power from the battery to an appliance body such as a portable telephone. The body has a function capable of charging the battery. The circuit board 11 also serves to supply the charging power from the body to the battery. Therefore, the circuit board 11 includes a protecting circuit (not shown) for excessive charging and excessive discharging.

The vessel 2 is formed in a shape of a rectangular prism having a hollow structure. As seen from FIG. 11, an opening 6 is formed at the back of the vessel 2. Terminal portions 12 (described later) which are formed on the surface of the circuit board 11 overlook the outside through the opening 6. The battery pack 1 is connected to the above appliance body in such a manner that the terminal portions 12 are brought into contact with connector pins on the side of the body of the portable telephone.

The circuit board 11 may be a square-shaped rigid-type printed wiring board which is made of e.g. glass epoxy resin. Within the vessel, the circuit board 11 is arranged in the vicinity of the one end 2a of the vessel 2 in the longitudinal direction so that it is not brought into contact with the battery. On the surface of the circuit board 11, a wiring pattern (not shown) made of e.g. a copper foil is formed. At prescribed positions of the wiring pattern, electronic components such as an IC and resistor are formed. Further, the circuit board 11 is provided with a connecting terminal 7 which is to be connected to the battery in the vessel 2.

Figure 2:
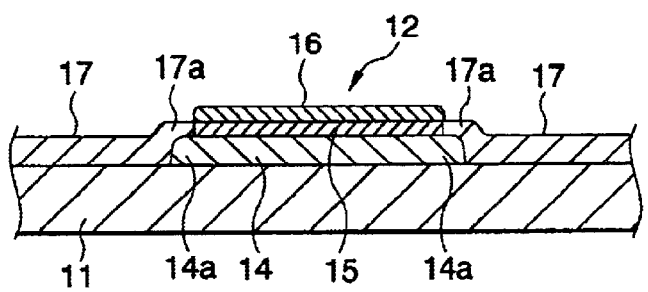
FIG. 2 is a sectional view of a terminal portion shown in FIG. 1.

On the surface of the circuit board 11, terminal portions 12 each is formed as a thin film. As seen from FIG. 2, the terminal portion 12 is composed of a base layer 14 of copper formed on the circuit board 11, a first plated layer 15 of nickel formed on the base layer 14 by e.g. plating and a second plated layer 16 of gold formed on the first plated layer 15 as an uppermost layer by e.g. plating. Incidentally, although not shown in FIG. 2, a wiring pattern is connected to the base layer 14. As for the thickness of each layer, the base layer 14 has a thickness of about 35 $\mu$m; the first plated layer 15 has a thickness of about 4 $\mu$m or more; and the second plated layer 16 has a thickness of about 1.5 m$\mu$ or more.

The first plated layer 15, which is made of nickel, increases the bonding strength between the base layer 14 of copper and the second plated layer 16 of gold. The second plated layer constituting the uppermost layer of the terminal portion 12, which is made of gold, increases the anti-corrosiveness and decoration.

Further, on the surface of the circuit board 11, an insulating layer 17 is formed on the other area than the area where the base layer 14 is formed. The insulating layer 17 which is called green resist serves to protect the surface of the circuit board 17 and wiring pattern. The insulating layer 17 is made of epoxy resin to have electrical insulation, and has a thickness of about 7 $\mu$m.

As described above, the terminal portion 12 is composed of the base layer 14, first plated layer 15 and second plated layer 16 which are successively stacked, and formed as a thin film on the circuit board. For this reason, as compared with the conventional structure provided with an electronic component such as a terminal stand, the structure according to this invention can reduce the component cost and also decreases the mounting height of the components on the circuit board 11. Thus, the thickness of the battery pack 1 can be reduced. This contributes to reduction in thickness, size and weight of the portable telephone.

Additionally, as described above, where the thin-film terminal portions 12 are employed in place of the conventional terminal stand for connection to the appliance body, the mounting height in the circuit board 11 is extremely decreased. Therefore, in order to maintain contact resistance between the terminal portions and a connector pins of the body, it is preferred that the circuit board 11 is located at a suitable relative position to the vessel 2.

Meanwhile, as described above, where the thin-film terminal portion 12 is formed on the circuit board 11, the following failure may occur according to the manufacturing method. Specifically, the above terminal portion 12 is manufactured as follows. First, the base layer 14 is formed by a known photolithography. Subsequently, the insulating layer 17 of e.g. epoxy resin is formed on the other area than the area where the terminal portion 12 is formed on the surface of the circuit board 11. This insulating layer 17 is also formed by the known photolithography. More specifically, as seen from FIG. 2, the end 17a of the insulating layer 17 is formed to extend over the peripheral edge of the base layer 14. Thereafter, the upper surface of the base layer 14 is plated with nickel to form the first plated layer 15, and the upper surface of the first plated layer 15 is plated with gold to form the second plated layer 16.

Figure 3:
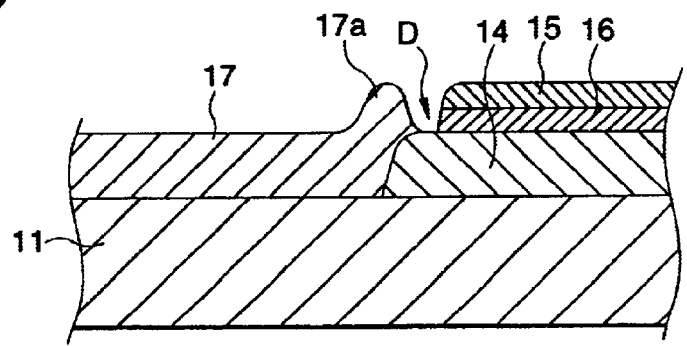
FIG. 3 is an enlarged sectional view of a terminal portion shown in FIG. 1.

According to such a manufacturing process, the following events may occur. Owing to the heat generated when the plated layers 15 and 16 are formed, as seen from FIG. 3, the epoxy resin constituting the insulating layer 17 contracts so that a gap D is generated between the end 17a of the insulating layer 17 and the first plated layer 15 of nickel. As a result, the surface of the base layer 14 is partially exposed externally. When water, hydrogen sulfide or sulfur dioxide gas invades between the gap D, crystal of impurities is created, and deteriorates the surface of the second plated layer 16 of gold.

Figure 4:
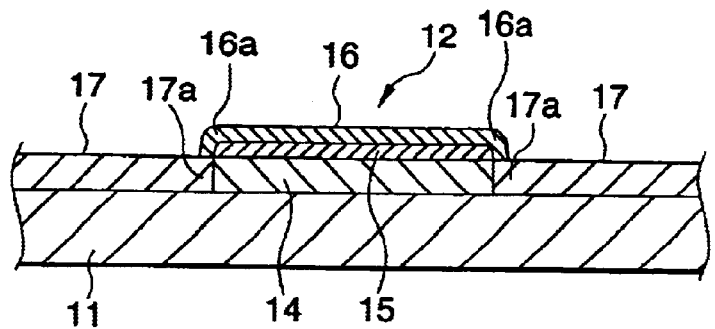
FIG. 4 is a sectional view of a terminal portion in a modification of this invention.
Figure 5:
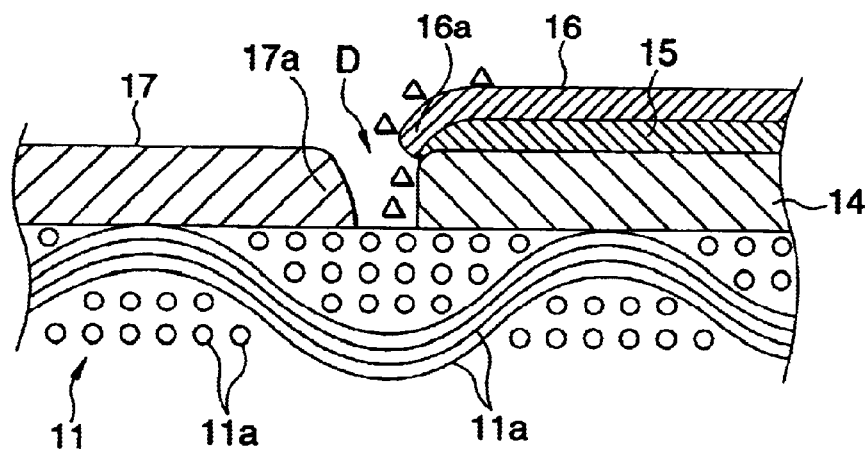
FIG. 5 is an enlarged sectional view of the terminal portion shown in FIG. 4.

Further, as seen from FIG. 4, where the insulating layer 17 is formed on the periphery of the base layer 14 after the base layer 14 has been formed and thereafter the first and the second plated layer 15 and 16, a peripheral edge 16a of the second plated layer 16 is created so as to cover the end 17a of the insulating layer 17 close to the base layer 14. In this case, if the insulating layer 17 contracts like the above case, as shown in FIG. 5, a gap D is generated between the insulating layer 17 and the base layer 14. As a result, the surface of the base layer 14 and the surface of the circuit board 11 are exposed externally.

The circuit board 11 of glass epoxy resin has a construction in which a plurality of glass fibers 11a intersect crosswise and a resin component (not shown) is contained in the gaps among the intersecting glass fibers. However, under the influence of the knitting manner of the glass fibers 11a, when the surface of the circuit board 11 is exposed externally, the circuit board 11 is impregnated with water. In this case, copper constituting the base layer 14 is ionized so that the copper ions (triangle marks in FIG. 5) propagate within the circuit board 11 and moves along the surface of the base layer 14 from the exposed region of the gap D. Thus, the copper ions are separated as a copper compound on the second plated layer 16. This deteriorates the surface of the second plated layer 16.

In accordance with this embodiment, in order to overcome the above failure, the following contrivance is adopted. On the circuit board 11, the insulating layer 17 is formed on the other area than the area where the terminal portion 12 is formed. In this case, as seen from FIG. 6, the insulating layer 17 is formed so as to cover the peripheral edge 16a of the second plated layer 16 at its end 17a so that the surface of the base layer 14 is not exposed externally. When the insulating layer 17 is formed so as to cover the peripheral edge 17a of the second plated layer 16 sufficiently, even if the insulating layer 17 contracts owing to a cause such as heat, a gap D is not generated. Therefore, the surface of the base layer 14 is not exposed externally. This prevents invasion of water, hydrogen sulfide or sulfur dioxide, thereby suppressing the surface deterioration of the second plated layer 16.

Further, as shown in FIG. 5, even where the copper compound has been separated on the second plated layer 16, if the insulating layer 17 is formed to cover the peripheral edge 16a of the second plated layer 16, the gap D is not generated so that the surfaces of the circuit board 11 and the base layer 14 are not exposed externally. This prevents invasion of water and others, and hence prevents deterioration of the surface of the second plated layer.

Figure 7:
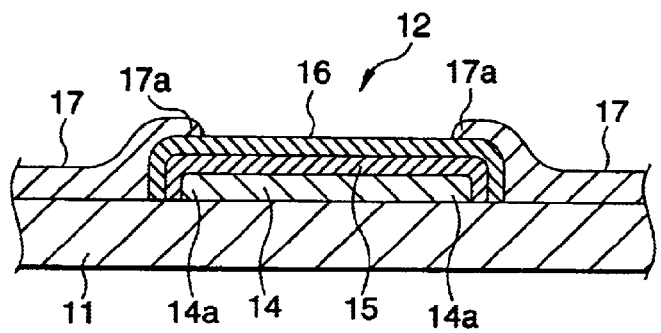
FIG. 7 is a sectional view of a terminal portion shown in a modification of this invention.

Additionally, as shown in FIG. 7, such an arrangement can be proposed that the first plated layer 15 and second plated layer 16 are formed to cover the peripheral edge 14a of the base layer 14 and the end 17a of the insulating layer 17 covers the peripheral edges of these layers. In accordance with such an arrangement, the peripheral edge of the base layer 14 and the first plated layer 15 are doubly covered with the second plated layer 16 and insulating layer 17. This arrangement greatly reduces possibility that the base layer 14 and the first plated layer 15 are exposed externally, thereby surely preventing invasion of the water and others.

Figure 8:
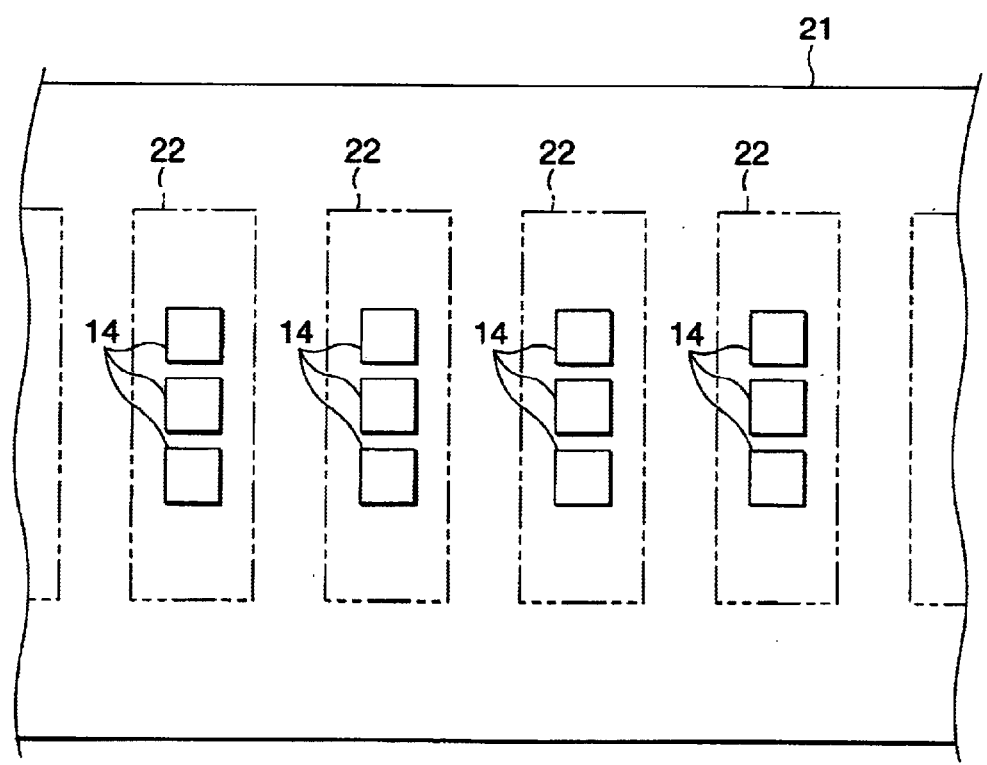
FIGS. 8 and 9 are views for explaining a method of manufacturing a circuit board according to this invention.

An explanation will be given of a method of manufacturing the above circuit board 11. The circuit board will be manufactured using long lengths of an integral board 21 as shown in FIG. 8. The integral board 21 is constructed of an ordinary rigid plate. On the surface of such an integral board 21, a wiring pattern is formed in each of the areas 22 (one-dot broken line in FIG. 8) corresponding to the circuit board 11 by the known photolithography.

Specifically, a resist material is applied to the integral board 21 covered with a copper foil, and using a prescribed pattern as a mask, exposure and development are made for the circuit board. Thereafter, the wiring pattern and the base layer are formed in the area 22 corresponding to the circuit board 11. The base layer 14 is plated with nickel or the like to form the first plated layer 15. Thereafter, the first plated layer 15 is plated with gold or the like to form the second plated layer 16.

Figure 6:
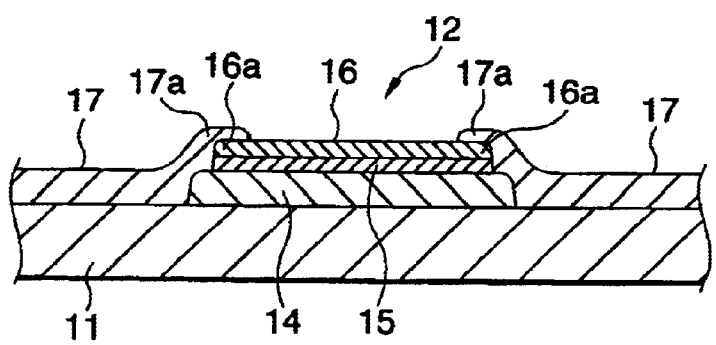
FIG. 6 is a sectional view of the terminal portion in another modification of this invention.

In this case also, by the known photolithography, the insulating layer 17 is formed on the surface of the area 22 corresponding to the circuit board 11 in the other area than the area where the terminal portion is formed. The insulating layer 17 is formed so as to cover the peripheral edge 16a of the second plated layer 16 in the terminal portion 12 so that the surfaces of the circuit board 11 and the base layer 14 are not exposed externally (FIG. 6). Subsequently, by "solder reflow" processing, electronic components such as an IC, resistor, etc. are mounted at the predetermined positions on the wiring pattern.

Figure 9:
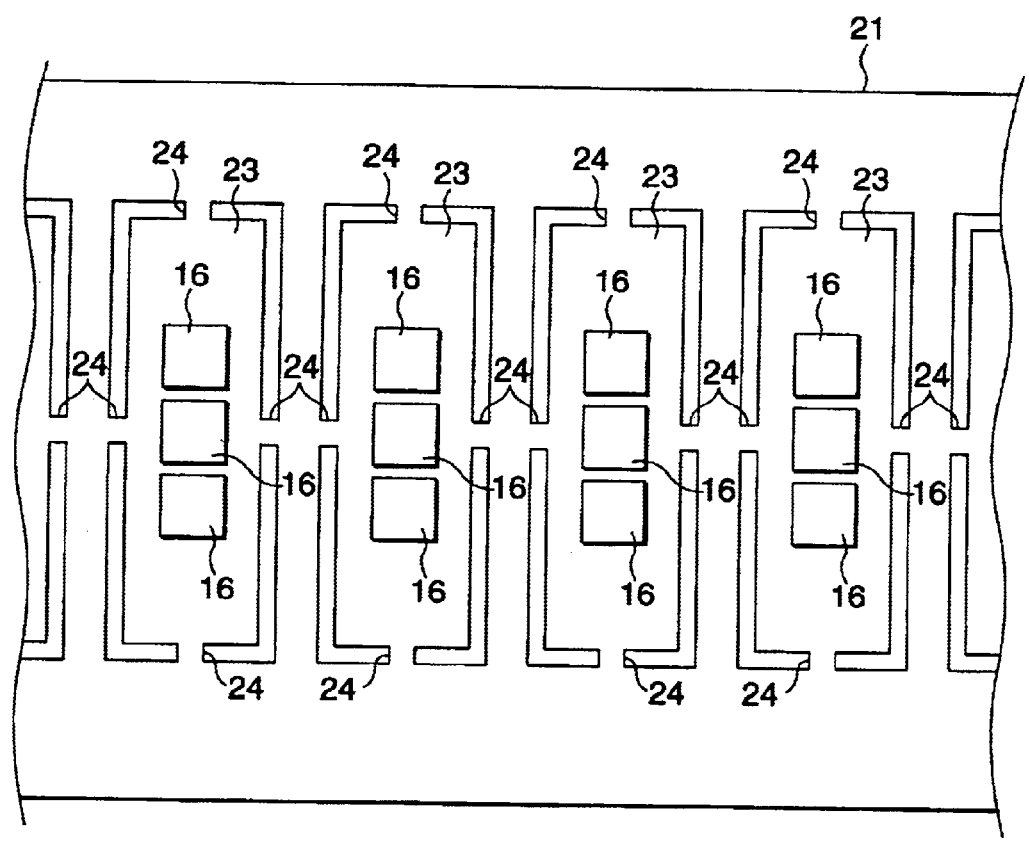
Figure 10:
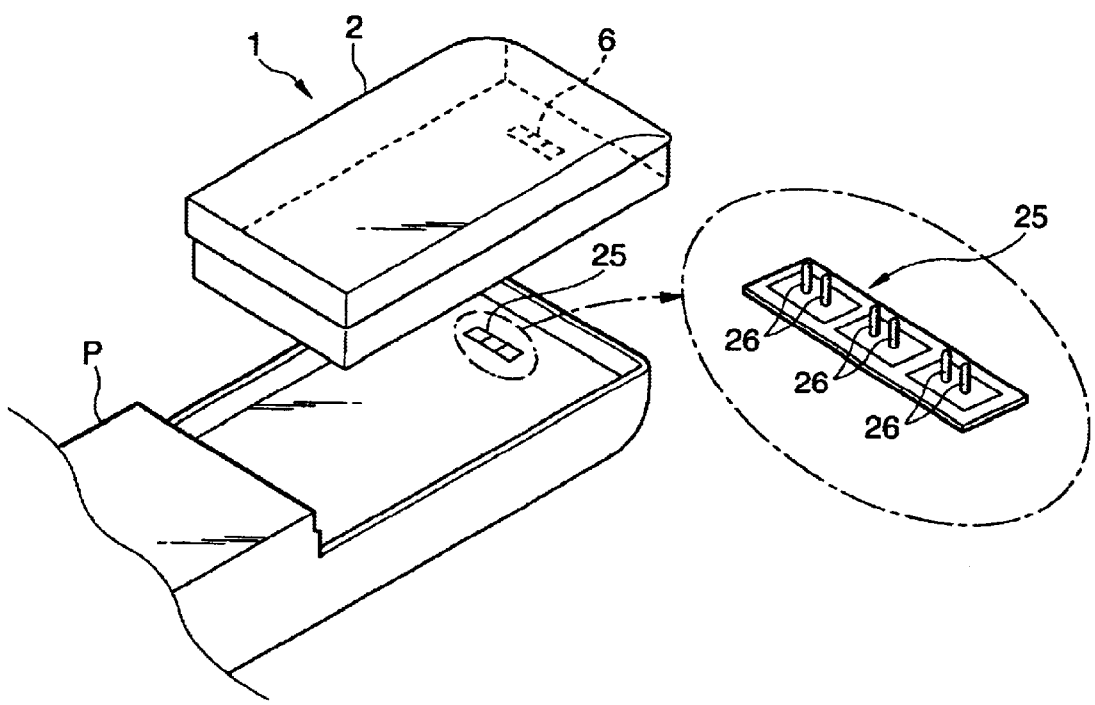
FIG. 10 is a perspective view showing the manner of mounting a battery pack in a portable telephone.

Thereafter, as shown in FIG. 9, using a predetermined mold, the integral board 21 is stamped out along each of the areas 22 described above, thereby providing a plurality of board products each corresponding to the circuit board 11. After coupling portions 24 has been cut out, the connecting terminal 7 is connected to provide the circuit board 11 as shown in FIG. 1. The circuit board 11 thus manufactured is built into the battery pack 1 as shown in FIG. 10.

The battery pack 1 incorporating the circuit board 11 is mounted at a prescribed position, e.g. on the rear side of the body P of a portable telephone. In this case, the body P of the portable telephone is provided with a connector 25 at the position corresponding to the terminal portion 12 of the battery pack 1. The connector 25 is provided with a plurality of connector pins 26. In a state where the battery pack 1 is attached to the body P of the portable telephone, the terminal portion 12 is brought into contact with the connector pins 26 so that the battery pack 1 is electrically connected to the body.

It should be noted that the scope of this invention should not be limited to the embodiments described above. For example, the stacking structure in the terminal portion 12 should not be limited to that described with reference to the embodiment described above. The circuit board 11 is applied to not only to the battery pack 1 but also a small-sized electronic appliance such as a camera, video appliance, etc. Further, the number of the terminals 12 should not be limited to the number as illustrated.

What is claimed is:

1. A battery pack comprising:

a vessel;

a battery mounted in the vessels; and a circuit board connected to the battery;

wherein an opening is formed on the surface of the vessel and a thin-film terminal portion is formed on the surface of the circuit board so that it is exposed externally through the opening and said terminal portion includes a base layer formed on said circuit board and a plated layer formed on said base layer, and said plated layer is made of sold, wherein on said circuit board, an insulating layer is formed in the other area than the area where said terminal portion is formed, and said insulating layer is formed so as to cover the peripheral edge of said plated layer so that the surface of said circuit board and/or the surface area of the base layer are not exposed externally.

2. A battery pack according to claim 1, wherein said circuit board includes said terminal portion and an insulating layer portion, said terminal portion including a pattern of the base layer of a copper foil and a plated layer formed to cover the entire pattern of said base layer, and said insulating layer portion being formed of an insulating layer which exposes only a portion of the source of said plated layer and covers the remaining area, wherein said plated layer is protruded on the surface of said insulating layer and said insulating layer is made of resin.

3. A battery pack according to claim 2, wherein said circuit board is a hybrid integrated circuit comprising protecting circuit for excessive charging and excessive discharging.

* * * * *